United States Patent
Aoki et al.

(10) Patent No.: US 10,174,225 B2
(45) Date of Patent: Jan. 8, 2019

(54) ADHESIVE COMPOSITION

(71) Applicant: DEXERIALS CORPORATION, Tokyo (JP)

(72) Inventors: Masaharu Aoki, Utsunomiya (JP); Hidetsugu Namiki, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/579,050

(22) PCT Filed: Jun. 1, 2016

(86) PCT No.: PCT/JP2016/066195
§ 371 (c)(1),
(2) Date: Dec. 1, 2017

(87) PCT Pub. No.: WO2016/194952
PCT Pub. Date: Dec. 8, 2016

(65) Prior Publication Data
US 2018/0171184 A1  Jun. 21, 2018

(30) Foreign Application Priority Data
Jun. 2, 2015 (JP) .................. 2015-112187

(51) Int. Cl.
*C09J 181/02* (2006.01)
*C09J 9/02* (2006.01)
(Continued)

(52) U.S. Cl.
CPC ........ *C09J 9/02* (2013.01); *C08K 5/17* (2013.01); *C08L 81/02* (2013.01); *C09J 11/04* (2013.01);
(Continued)

(58) Field of Classification Search
CPC . C09J 9/02; C09J 163/00; C09J 133/02; C09J 181/04; C09J 11/04; C09J 11/08;
(Continued)

(56) References Cited

U.S. PATENT DOCUMENTS 5,593,731 A * 1/1997 Akagi .................. C08G 59/70
427/386
6,831,117 B2 * 12/2004 Matsushima .......... C08K 5/544
428/391

(Continued)

FOREIGN PATENT DOCUMENTS

| JP | 2002-212537 A | 7/2002 |
| JP | 2006-316259 A | 11/2006 |
| JP | 2009-197206 A | 9/2009 |
| JP | 2014-065766 A | 4/2014 |
| JP | 2015-054942 A | 3/2015 |

OTHER PUBLICATIONS

Mar. 29, 2017 International Preliminary Report on Patentability issued in International Patent Application No. PCT/JP2016/066195.
(Continued)

*Primary Examiner* — Dao H Nguyen
(74) *Attorney, Agent, or Firm* — Oliff PLC

(57) ABSTRACT

An adhesive composition, capable of achieving excellent life performance and a wide margin for mounting, includes a cationic polymerizable compound, an aluminum chelate/silanol-based curing catalyst, and a nucleophilic compound containing a sulfur atom having an unshared electron pair. The nucleophilic compound is a thiol compound or an episulfide compound. The aluminum chelate/silanol-based curing catalyst includes an aluminum chelate curing agent, and a silanol compound or a silane coupling agent. The aluminum chelate curing agent constitutes a latent aluminum chelate curing agent carried by a porous resin obtained through interfacial polymerization of a polyfunctional isocyanate compound.

11 Claims, 5 Drawing Sheets

(51) Int. Cl.
*C08K 5/17* (2006.01)
*H01L 33/62* (2010.01)
*C08L 81/02* (2006.01)
*C09J 11/04* (2006.01)
*C09J 11/06* (2006.01)
*C09J 11/08* (2006.01)
*C09J 133/00* (2006.01)
*C09J 163/00* (2006.01)
*C09J 201/02* (2006.01)
*C09J 133/02* (2006.01)
*C09J 133/08* (2006.01)
*C09J 181/04* (2006.01)

(52) U.S. Cl.
CPC ............... *C09J 11/06* (2013.01); *C09J 11/08* (2013.01); *C09J 133/00* (2013.01); *C09J 133/02* (2013.01); *C09J 133/08* (2013.01); *C09J 163/00* (2013.01); *C09J 181/04* (2013.01); *C09J 201/02* (2013.01); *H01L 33/62* (2013.01); *H01L 2224/16225* (2013.01); *H01L 2224/73204* (2013.01)

(58) Field of Classification Search
CPC .......... C09J 133/08; H01L 33/62; C08K 5/17; C08L 81/02
USPC ........... 257/99, E21.503, E21.514; 424/70.1; 428/402.2, 407; 523/211, 213; 524/236, 524/261, 262; 525/524, 535; 528/373, 528/374, 376
See application file for complete search history.

(56) References Cited

U.S. PATENT DOCUMENTS

| | | | |
|---|---|---|---|
| 8,927,626 B2 * | 1/2015 | Kamiya | C08G 18/0852 523/211 |
| 9,382,462 B2 * | 7/2016 | Rao | C08G 75/045 |
| 2002/0151627 A1 | 10/2002 | Matsushima | |
| 2003/0100641 A1 * | 5/2003 | Jiang | C07C 13/40 524/236 |
| 2010/0036063 A1 * | 2/2010 | Sawant | C08G 75/02 525/535 |
| 2015/0209914 A1 * | 7/2015 | Ishigami | H01L 33/62 257/99 |

OTHER PUBLICATIONS

Aug. 9, 2016 Search Report issued in International Patent Application No. PCT/JP2016/066195.

Aug. 9, 2016 Written Opinion issued in International Patent Application No. PCT/JP2016/066195.

* cited by examiner

ADHESIVE COMPOSITION

TECHNICAL FIELD

The present invention relates to an adhesive composition containing an aluminum chelate/silanol-based curing catalyst.

BACKGROUND ART

An aluminum chelate/silanol-based curing catalyst, which cationically polymerizes an epoxy compound by cooperation of an aluminum chelate curing agent and a silane coupling agent (or a silanol compound), has been conventionally known (for example, see Patent Literature 1). In this aluminum chelate/silanol-based curing catalyst, a cation species and an anionic species coexist as active species.

CITATION LIST

Patent Literature

Patent Literature 1: Japanese Patent Application Laid-Open No. 2009-197206

SUMMARY OF INVENTION

Technical Problem

Due to the coexistence of the cation species and the anionic species as active species, the aluminum chelate/silanol-based curing catalyst has low stability, thus making it difficult to obtain excellent life performance. Further, the aluminum chelate/silanol-based curing catalyst has a rapid curing reaction rate and thus requires a temperature profile control during thermocompression bonding.

The present invention aims at solving the aforementioned problems in association with the conventional technique, and has an object of providing an adhesive composition capable of achieving excellent life performance and a wide margin for mounting.

Solution to Problem

The present inventors have conducted earnest studies, and have found that compounding a nucleophilic compound containing a sulfur atom having an unshared electron pair enables to improve the life performance and achieve the wide margin for mounting.

That is, an adhesive composition according to the present invention is characterized by including a cationic polymerizable compound, an aluminum chelate/silanol-based curing catalyst, and a nucleophilic compound containing a sulfur atom having an unshared electron pair.

Further, a light emitting device according to the present invention is characterized by including a substrate having a wiring pattern, an anisotropic conductive film formed on an electrode of the wiring pattern, and a light emitting element mounted on the anisotropic conductive film, wherein the anisotropic conductive film is a cured product of an anisotropic conductive adhesive including a cationic polymerizable compound, an aluminum chelate/silanol-based curing catalyst, and a nucleophilic compound containing a sulfur atom having an unshared electron pair.

Advantageous Effects of Invention

According to the present invention, the addition of the nucleophilic compound containing a sulfur atom having an unshared electron pair can improve the stability of the aluminum chelate/silanol-based curing catalyst and delay the curing reaction, thereby enabling to achieve the excellent life performance and the wide margin for mounting.

DESCRIPTION OF EMBODIMENTS

Hereinafter, an embodiment of the present invention will be described in detail with reference to the drawings in the following order.
1. Adhesive composition
2. Light emitting device
3. Implementation Examples

1. Adhesive Composition

An adhesive composition according to the present embodiment includes a cationic polymerizable compound, an aluminum chelate/silanol-based curing catalyst, and a nucleophilic compound containing a sulfur atom having an unshared electron pair.

As shown in the following formulas (1) and (2), the aluminum chelate/silanol-based curing catalyst generates a cation species and an anionic species and cationically polymerizes a cationically polymerizable compound by cooperation of an aluminum chelate curing agent and a silane coupling agent (or a silanol compound).

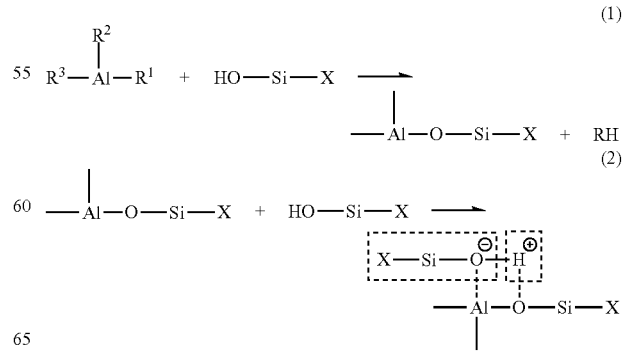

In the present embodiment, the addition of the nucleophilic compound containing a sulfur atom having an unshared electron pair can improve the stability of the aluminum chelate/silanol-based curing catalyst and delay the curing reaction, thereby enabling to achieve excellent life performance and a wide margin for mounting.

Figure 1:
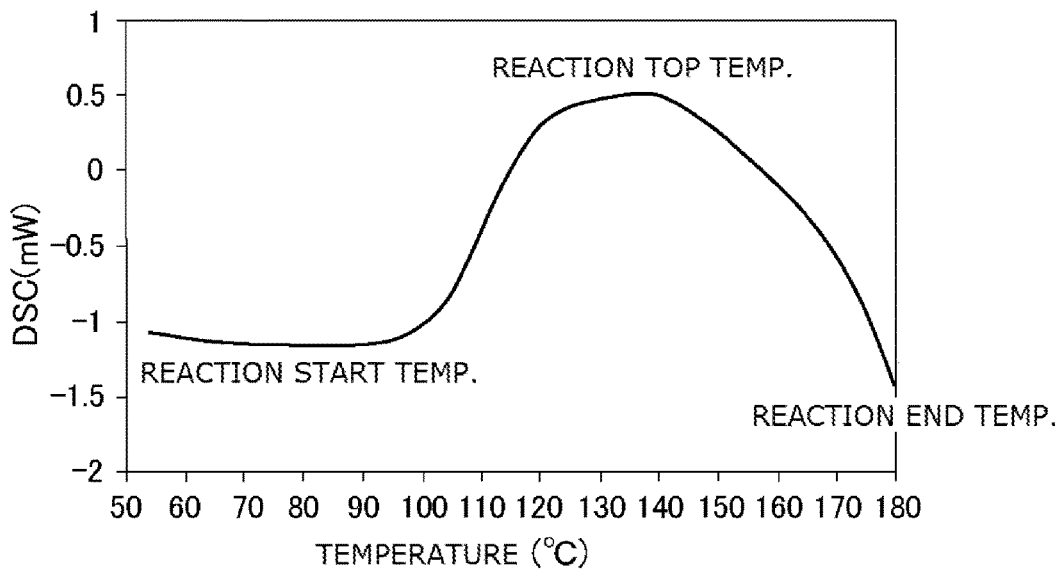
FIG. 1 is a graph showing a measurement example of an aluminum chelate/silanol-based curing catalyst, to which a nucleophilic compound is added, using a differential scanning calorimeter (DSC).
Figure 2:
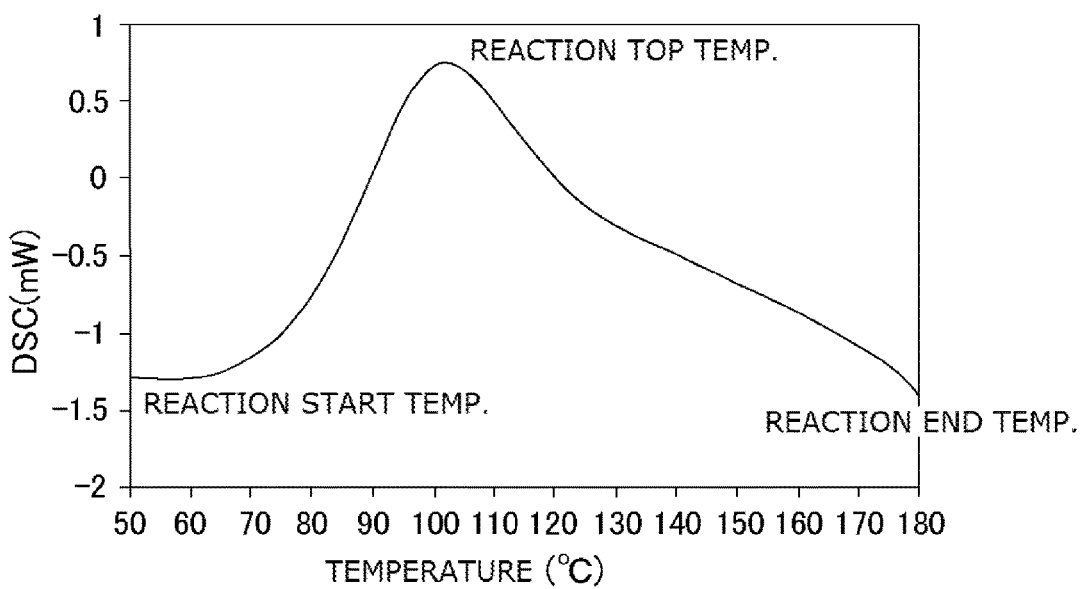
FIG. 2 is a graph showing a measurement example of a conventional aluminum chelate/silanol-based curing catalyst using the differential scanning calorimeter (DSC).

FIG. 1 is a graph showing a measurement example of the aluminum chelate/silanol-based curing catalyst, to which the nucleophilic compound is added, using a differential scanning calorimeter (DSC). FIG. 2 is a graph showing a measurement example of a conventional aluminum chelate/silanol-based curing catalyst using the differential scanning calorimeter (DSC).

As is evident from FIG. 1 and FIG. 2, the addition of the nucleophilic compound enables to shift a reaction top (peak) temperature to a high temperature side. Specifically, a reaction start temperature and the reaction top temperature can be delayed without changing a reaction end temperature. Since the reaction end temperature stays the same, it is not necessary to change mounting conditions or prolong a production time. Further, delay in the reaction start temperature can extend the life of the adhesive at a room temperature. Further, delay in the reaction top temperature can extend a time during which the adhesive stays wet with a base material such as, for example, aluminum, thereby enabling to improve adhesion strength. Such phenomena may be caused by the following reason. The nucleophilic compound is coordinated to the aluminum chelate curing agent to form a stable state at the room temperature. The coordinated nucleophilic compound is then released from the aluminum chelate curing agent by heating to initiate the reactions of the above formulas (1) and (2). These events can be also speculated from the fact that after the reaction top temperature is shifted to the high temperature side as shown in FIG. 1 by adding a mercapto-based coupling agent as the nucleophilic compound, the shift is returned to a state which the mercapto-based coupling agent is not added, represented by the graph shown in FIG. 2, by hydrolyzing the mercapto-based coupling agent in a humidity environment.

Further, in the adhesive composition to which the nucleophilic compound is added, the reaction peak temperature at a temperature rising rate of 10° C./min measured by the differential scanning calorimeter is preferably higher than the reaction start temperature by 50° C. or more. Having the reaction peak temperature higher than the reaction start temperature by 50° C. or more causes the curing reaction to delay, and thus the base material and a resin can be familiarized with each other even under a thermocompression bonding condition having a sharp temperature raising curve to achieve high die shear strength and peel strength. As a result, excellent bonding properties and the wide margin for mounting can be achieved under both the thermocompression bonding condition having a sharp temperature raising curve and the thermocompression bonding condition having a slow temperature raising curve. Note that the reaction peak temperature can be controlled by, for example, the number of SH groups and an addition amount of the nucleophilic compound.

The cationic polymerizable compound, the aluminum chelate/silanol-based curing catalyst, and the nucleophilic compound will be described hereinafter.

[Cationic Polymerizable Compound]

The cationic polymerizable compound has a functional group capable of performing polymerization by a cation species. Examples of the cationic polymerizable compound may include an epoxy compound, a vinyl ether compound, and a cyclic ether compound, and one or more kinds thereof may be used. Of these, an epoxy compound is preferably used.

Examples of the epoxy compound may include an alicyclic epoxy compound, a bisphenol type epoxy resin derived from epichlorohydrin and bisphenol A or bisphenol F, polyglycidyl ether, polyglycidyl ester, an aromatic epoxy compound, a novolak type epoxy compound, a glycidyl amine-based epoxy compound, and a glycidyl ester-based epoxy compound, and one or more kinds thereof may be used. Of these, the alicyclic epoxy compound or the hydrogenated epoxy compound are preferably used as these compounds hardly cause an addition reaction in which a silanolate anion generated from the silane coupling agent is added to a β carbon.

The alicyclic epoxy compound preferably has two or more epoxy groups in its molecule. Such an alicyclic epoxy compound may be liquid or solid. Specific examples thereof may include 3,4-epoxycyclohexenylmethyl-3',4'-epoxycyclohexanecarboxylate and glycidyl hexahydrobisphenol A. Of these, 3,4-epoxycyclohexenylmethyl-3',4'-epoxycyclohexanecarboxylate is preferably used because it can ensure light permeability suitable for mounting a light emitting diode (LED) element and the like when it is cured to form a cured product and is also excellent in rapid curability.

As the hydrogenated epoxy compound, a hydrogenated product of the alicyclic epoxy compound described above and a hydrogenated epoxy compound of a known epoxy compound such as a bisphenol A type epoxy compound and a bisphenol F type epoxy compound may be used.

[Aluminum Chelate/Silanol-Based Curing Catalyst]

The aluminum chelate/silanol-based curing catalyst includes the aluminum chelate curing agent and the silanol compound.

As the aluminum chelate curing agent, a known agent thereof may be used. However, for example, a complex compound represented by the formula (3), in which three β-ketoenolate anions are coordinated to aluminum, is preferably used.

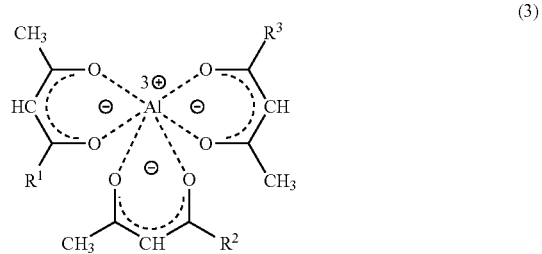

(3)

In the formula, R1, R2, and R3 are each independently an alkyl group or an alkoxyl group. Examples of the alkyl group may include a methyl group and an ethyl group. Examples of the alkoxyl group may include a methoxy group, an ethoxy group, and an oleyloxy group.

Specific examples of the aluminum chelate curing agent represented by the formula (3) may include aluminum tris(acetylacetonate), aluminum tris(ethylacetoacetate), aluminum monoacetylacetonate bis(ethylacetoacetate), aluminum monoacetylacetonate bisoleylacetoacetate, ethylacetoacetate aluminum diisopropylate, and alkylacetoacetate aluminum diisopropylate.

Examples of the silanol compound may include an aryl silanol represented by the formula (4).

$$(Ar)_m Si(OH)_n \qquad (4)$$

In the formula, m is 2 or 3, however, the sum of m and n is 4. The silanol compound represented by the formula (4) is a monool or diol derivative. "Ar" is an aryl group optionally substituted. Examples of the aryl group may include a phenyl group, a naphthyl group, an anthracenyl group, an azulenyl group, a fluorenyl group, a thienyl group, a furyl group, a pyrrolyl group, an imidazolyl group, and a pyridyl group. Of these, the phenyl group is preferable from the viewpoint of easiness in acquisition and an acquisition cost. Ar(s) with the number of m may be the same or different. However, Ar(s) are preferably the same from the viewpoint of easiness in acquisition.

These aryl groups may have 1 to 3 substituents. Examples of such substituents may include: an electron withdrawing group such as a halogen such as chloro and bromo; trifluoromethyl; nitro; sulfo; carboxyl; an alkoxy carbonyl such as methoxycarbonyl and ethoxycarbonyl; formyl, and an electron donating group such as an alkyl such as methyl, ethyl, and propyl; an alkoxy such as methoxy and ethoxy; hydroxy; amino; a monoalkylamino such as monomethylamino; a dialkylamino including dimethylamino. Note that using the electron withdrawing group as a substituent enables to increase an acidity of a hydroxyl group of the silanol. Conversely, using the electron donating group enables to reduce the acidity thereof. This makes it possible to control the curing activity. Here, the substituents may differ for each of the Ar(s) with the number of m. However, these substituents are preferably the same from the viewpoint of easiness in acquisition of the Ar(s) with the number of m. Further, some of the Ar(s) may have substituents, while the other Ar(s) may not have substituents.

Preferable examples of the silanol compound represented by the formula (4) may include triphenylsilanol and diphenylsilanol. Particularly preferred is triphenylsilanol.

Further, the aluminum chelate curing agent and the silanol compound preferably constitute a latent aluminum chelate curing agent carried by a porous resin obtained through interfacial polymerization of a polyfunctional isocyanate compound. This latent aluminum chelate curing agent can be prepared as follows. An oil phase, obtained by dissolving and dispersing the aluminum chelate curing agent, the polyfunctional isocyanate compound, a radical polymerizable compound, a radical polymerization initiator, and the silanol compound in an organic solvent, is charged into an aqueous phase including a dispersant while the mixture is heated and stirred. This causes the polyfunctional isocyanate compound to undergo interfacial polymerization and the radical polymerizable compound to undergo radical polymerization simultaneously. As a result, the aluminum chelate curing agent and the silanol compound can be carried by a porous resin thus obtained.

The polyfunctional isocyanate compound preferably contains two or more, and more preferably three, isocyanate groups per molecule. Examples of the trifunctional isocyanate compound may include: a trimethylolpropane (TMP) adduct product represented by the formula (5), obtained by reacting 1 mole of TMP with 3 moles of a diisocyanate compound; an isocyanurate product represented by the formula (6), obtained by self-condensation of 3 moles of a diisocyanate compound; and a biuret product represented by the formula (7), obtained by condensation of diisocyanate urea obtained from 2 moles of 3 moles of a diisocyanate compound with the remaining 1 mole of the diisocyanate.

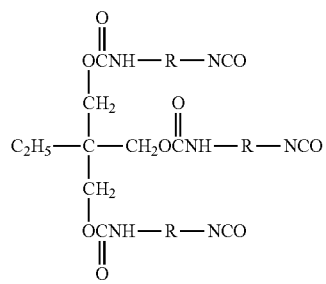

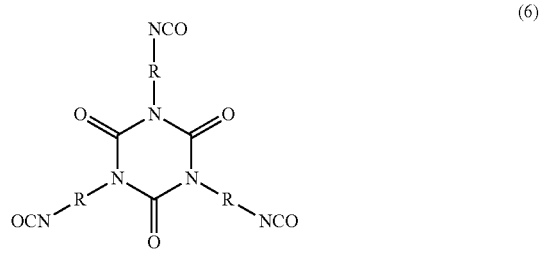

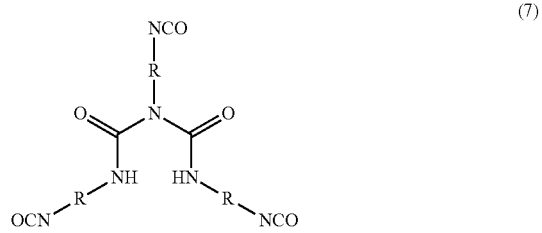

In the above formulas (5) to (7), a substituent R is a residual portion of the diisocyanate compound obtained by removing an isocyanate group. Specific examples of such a diisocyanate compound may include toluene 2,4-diisocyanate, toluene 2,6-diisocyanate, m-xylylene diisocyanate, hexamethylene diisocyanate, hexahydro-m-xylylene diisocyanate, isophorone diisocyanate, and methylenediphenyl-4,4'-diisocyanate.

Using the latent aluminum chelate curing agent composed of such a porous resin and the aluminum chelate curing agent held in the pore of the porous resin can greatly improve storage stability even in a state of one solution in which the latent aluminum chelate curing agent is directly compounded to the cationic polymerizable compound.

When the content of the aluminum chelate curing agent is too small, the adhesive is not sufficiently cured, and when the content thereof is too large, resin properties (for example, crosslinkability) of a cured product of the adhesive composition tend to decrease. Thus, the content of the aluminum chelate curing agent is preferably 0.1 to 30 parts by mass, and more preferably 1 to 10 parts by mass relative to 100 parts by mass the cationic polymerizable compound.

Further, the aluminum chelate/silanol-based curing catalyst may include the aluminum chelate curing agent and the silane coupling agent described above.

The silane coupling agent has a function of initiating cationic polymerization in cooperation with the aluminum chelate curing agent, in particular, the latent aluminum chelate curing agent. It is preferred that such a silane coupling agent have, in its molecule, 1 to 3 lower alkoxy groups and a group reactive with a functional group of a cationic polymerizable resin, such as, for example, a vinyl group, a styryl group, an acryloyloxy group, a methacryloyloxy group, an epoxy group, and an amino group. Note that the coupling agent having an amino group may be used when the coupling agent does not substantially capture a cation species generated by the aluminum chelate/silanol-base curing catalyst.

Examples of such a silane coupling agent may include vinyltris(β-methoxyethoxy)silane, vinyltriethoxysilane, vinyltrimethoxysilane, γ-styryltrimethoxysilane, γ-methacryloxy-propyitrimethoxysane, γ-acryloxypropyltrimethoxysilane, β-(3,4-epoxycyclohexyl)ethyltrimethoxysilane, γ-glycidoxypropyltrimethoxysilane, γ-glycidoxypropylmethyldiethoxysilane, N-β-(aminoethyl)-γ-aminopropyltrimethoxysilane, N-β-(aminoethyl)-γ-aminopropylmethyldimethoxysilane, γ-aminopropyltriethoxysilane, N-phenyl-γ-aminopropyltrimethoxysilane, and γ-chloropropyltrimethoxysilane.

When the content of the silage coupling agent is too small, the adhesive is poorly cured, and when the content thereof is too large, resin properties (for example, storage stability) of a cured product of the composition tend to decrease. Thus the content of the silane coupling agent is preferably 0.1 to 30 parts by mass, and more preferably 1 to 10 parts by mass relative to 100 parts by mass of the cationic polymerizable compound.

Further, the aluminum chelate curing agent is preferably a latent aluminum chelate curing agent carried by a porous resin obtained through interfacial polymerization of a polyfunctional isocyanate compound. This latent aluminum chelate curing agent can be produced as follows. A solution, obtained by dissolving the aluminum chelate curing agent and the polyfunctional isocyanate compound in a volatile organic solvent, is charged into an aqueous phase containing a dispersant, and the mixture is heated and stirred to cause interfacial polymerization.

[Nucleophilic Compound]

The nucleophilic compound contains a sulfur atom having an unshared electron pair. Such a nucleophilic compound enables to shift the reaction peak temperature of the adhesive composition measured by the differential scanning calorimeter to a high temperature side higher than the reaction start temperature by 50° C. or more. This is because, it is supposed that, the nucleophilic compound is coordinated to the aluminum chelate curing agent to form a stable state at the room temperate an released from the aluminum chelate curing agent by heating. Further, such a nucleophilic compound delays the curing reaction and thus enables to familiarize the base mater and the resin even under a thermocompression bonding condition having a sharp temperature raising curve to achieve high die shear strength and peel strength.

Examples of the nucleophilic compound may include a thiol compound and an episulfide compound. Examples of the thiol compound may include: mercaptosilanes such as mercaptoalkyl-alkoxysilanes including 3-mercaptopropyltrimethoxysilane and 3-mercaptopropylmethyldimethoxysilane; and mercaptoalkanoates represented by 3-mercaptobutyrate derivatives or 3-mercaptopropinate derivatives, such as 1,4-bis (3-mercaptobutylyloxy) butane, pentaerythritol tetrakis(3-mercaptobutyrate), and pentaerythritol tetrakis(3-mercaptopropionate). Examples of a commercially available product of the 3-mercaptobutyrate derivatives may include products with trade name "Karenz MT BD1" (manufactured by Showa Denko K.K.) and "Karenz MT PE1" (manufactured by Showa Denko K.K.). Examples of the episulfide compound may include an episulfide compound or a hydrogenated episulfide compound, which has one or more skeletons selected from a chain aliphatic skeleton, an aliphatic cyclic skeleton, and an aromatic skeleton.

Further, the thiol compound preferably has two or more thiol groups (SH groups) per molecule, and the episulfide compound preferably has two or more episulfide groups per molecule. The shift of the reaction peak tends to be larger with increase in the number of functional groups such as the thiol group and the episulfide group.

When the content of the nucleophilic compound is too small, it becomes difficult to obtain a stability improving effect, and when the content thereof is too large, there is a risk that the cation species generated by the aluminum chelate/silanol-based curing catalyst is captured. Thus the content of the nucleophilic compound is preferably 0.1 to 100 parts by mass, and more preferably 0.5 to 50 parts by mass relative to 100 parts by mass of the cationic polymerizable compound.

Other Components

The adhesive composition according to the present embodiment may include an acrylic resin, preferably a copolymer of acrylic acid and an acrylic acid ester containing a hydroxyl group, as other components. In this manner, the adhesive composition can achieve high adhesive strength to an aluminum wire of which a surface is passivated. The preferable copolymer may include a copolymer of 0.5 to 10 wt % of acrylic acid and 0.5 to 10 wt % of the acrylic acid ester having a hydroxyl group with a weight-average molecular weight of 50,000 to 900,000.

Figure 3:
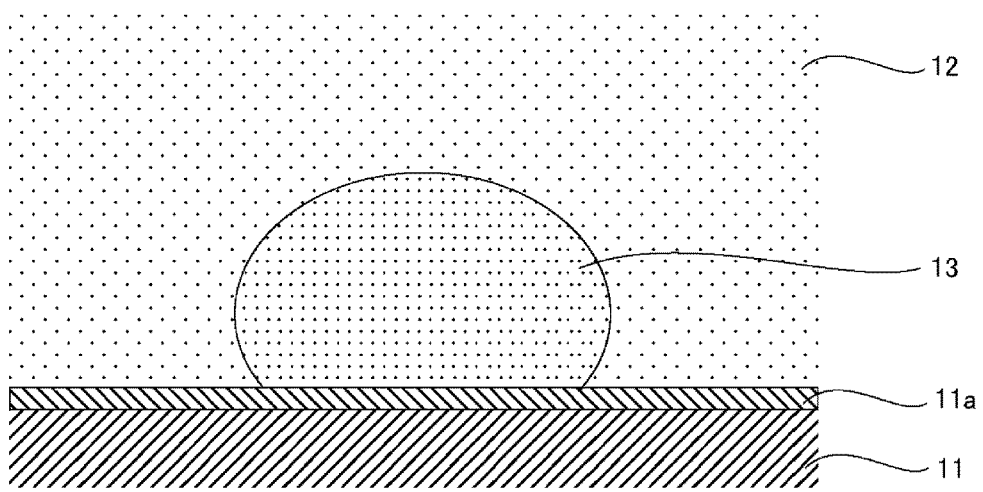
FIG. 3 is a cross-sectional view illustrating a sea-island model including an epoxy compound as a sea part and an acrylic resin as an island part.

FIG. 3 is a cross-sectional view illustrating a sea-island model including an epoxy compound as a sea part and an acrylic resin as an island part on an interface between the adhesive composition and an oxide film. This sea-island model is a model for a cured product in which an island 13 of the acrylic resin dispersed in sea 12 of the epoxy compound is in contact with a top of an oxide film 11a of a wire 11.

In this cured product model, acrylic acid reacts with the epoxy compound to establish a connection between the island 13 of the acrylic resin and the sea 12 of the epoxy compound and improves an anchoring effect between the oxide film 11a and the sea 12 of the epoxy compound by roughening a surface of the oxide film 11a. Further, the acrylic acid ester having a hydroxyl group obtains electrostatic adhesive force to the wire 11 by virtue of polarity of the hydroxyl group. Such a structure allows the entire cured product of the island 13 of the acrylic resin and the sea 12 of the epoxy compound to adhere to the oxide film thereby enabling to achieve excellent adhesive force.

In the cured product model shown in FIG. 3, a size of the island 13 of the acrylic resin is correlated with a weight-average molecular weight of the acrylic resin. When the acrylic resin has the weight-average molecular weight of 50,000 to 900,000, it becomes possible to bring the island 13 of the acrylic resin of a proper size into contact with the oxide film 11a. When the acrylic resin has the weight-average molecular weight of less than 50,000, a contact area between the island 13 of the acrylic resin and the oxide film 11a becomes small and an effect of improving adhesive force is not achieved. Further, when the acrylic resin has the weight-average molecular weight of greater than 900,000, the island 13 of the acrylic resin becomes too large to establish the state in which the entire cured product of the island 13 of the acrylic resin and the sea 12 of the epoxy compound is adhered to the oxide film 11a. Thus, the adhesive force decreases.

Further, the acrylic resin is formed of a raw material containing 0.5 to 10 wt %, more preferably 1 to 5 wt %, of acrylic acid. Including 0.5 to 10 wt % of acrylic acid enables to establish the connection between the island 13 of the acrylic resin and the sea 12 of the epoxy compound by reacting with the epoxy compound and improve the anchoring effect between the oxide film 11a and the sea 12 of the epoxy compound by roughening the surface of the oxide film 11a.

Further, the acrylic resin is formed of a raw material containing 0.5 to 10 wt %, more preferably 1 to 5 wt %, of the acrylic acid ester having a hydroxyl group. Including 0.5 to 10 wt % of the acrylic acid ester having a hydroxyl group enables to achieve the electrostatic adhesive force to the wire 11 by virtue of the polarity of the hydroxyl group.

Examples of the acrylic acid ester having a hydroxyl group may include 2-hydroxyethyl methacrylate, 2-hydroxypropyl methacrylate, 2-hydroxyethyl acrylate, and 2-hydroxypropyl acrylate. Of these, 2-hydroxyethyl methacrylate with excellent adhesion to the oxide film is preferably used.

Further, the acrylic resin may be formed from a raw material containing acrylic acid and an acrylic acid ester having a hydroxyl group, and further an acrylic acid ester having no hydroxyl group. Examples of the acrylic acid ester having no hydroxyl group may include butyl acrylate, ethyl acrylate, and acrylonitrile.

Further, the content of the acrylic resin is preferably 1 to 10 parts by mass, and more preferably 1 to 5 parts by mass, relative to 100 parts by mass of the epoxy compound. This enables to obtain the cured product in which the islands 13 of the acrylic resin are dispersed in the sea 12 of the epoxy compound with a suitable density.

Further, the adhesive composition according to the present embodiment may include an inorganic filler as other components to improve a particle capturing rate by controlling fluidity. No particular limitation is imposed on the inorganic filler, and silica, talc, titanium oxide, calcium carbonate, magnesium oxide, and the like may be used. Such an inorganic filler may be appropriately used to relieve the stress of a connection structure connected by the adhesive. Further, a softening agent such as a thermoplastic resin and a rubber component, and the like, may be compounded.

Such an adhesive composition can achieve high adhesive force to hardly adhesive metal such as aluminum.

Further, the adhesive composition may be an anisotropic conductive adhesive containing conductive particles. Any known conductive particles may be used as the conductive particles. Examples of the conductive particles may include: particles of various kinds of metal, such as nickel, iron, copper, aluminum, tin, lead, chrome, cobalt, silver, and gold, or particles of a metal alloy; those obtained by coating metal on surfaces of particles of metal oxide, carbon, graphite, glass, a ceramic, a plastic, or the like; and those obtained by further coating an insulating thin film on surfaces of these particles. When the metal is coated on the surfaces of resin particles, examples of the resin particles may include particles of an epoxy resin, a phenolic resin, an acrylic resin, an acrylonitrile-styrene (AS) resin, a benzoguanamine resin, a divinylbenzene-based resin, and a styrene-based resin. Further, the surfaces of the resin particles may be coated with Ni or the like to prevent an increase in resistance due to flattened deformation of the conductive particles. Of these, the conductive particles obtained by forming a metal layer on the surfaces of resin particles are preferably used. Such conductive particles are easily crushed and deformed during compression, thereby enabling to enlarge a contact area with a wiring pattern. Further, such conductive particles can absorb height variation of the wiring pattern.

The average particle diameter of the conductive particles is preferably 1 μm or more and 10 μm or less, and more preferably 1 μm or more and 8 μm or less. Further, the compounding amount of the conductive particles is preferably 1 part by mass or more and 100 parts by mass or less relative to 100 parts by mass of the epoxy compound from the viewpoint of connection reliability and insulation reliability.

Further, the conductive particles are preferably used in combination with solder particles. The solder particles preferably have the average particle diameter smaller than that of the conductive particles, and the average particle diameter of the solder particles is preferably equal to or more than 20% but less than 100%, of that of the conductive particles. When the solder particles are too small relative to the conductive particles, the solder particles are not held between opposing terminals during pressure bonding, thereby failing to form a metallic bond. Thus, such solder particles are unable to achieve excellent heat radiation properties and electrical properties. On the other hand, when the solder particles are too large relative to the conductive particles, shoulder touch is generated by the solder particles, far example, at an edge portion of LED chip, to cause leakage. As a result, a product yield is deteriorated.

The solder particles can be appropriately selected from, for example, Sn—Pb, Pb—Sn—Sb, Sn—Sb, Sn—Pb—Bi, Bi—Sn, Sn—Cu, Sn—Pb—Cu, Sn—In, Sn—Ag, Sn—Pb—Ag, and Pb—Ag based solder as defined in JIS Z 3282-1999, in accordance with an electrode material, connection conditions, and the like. Further, the shape of the solder particles can be appropriately selected from a granular shape, a flake shape, and the like. Noted that the solder particles may be coated with an insulating layer in order to improve anisotropic properties.

The compounding amount of the solder particles is preferably 1% by volume or more and 30% by volume or less. The insufficient compounding amount of the solder particles makes excellent heat radiation properties unobtainable, while the excessive compounding amount impairs the anisotropic properties and makes excellent connection reliability unobtainable.

Such an anisotropic conductive adhesive enables to achieve the excellent connection reliability to hardly adhesive metal such as aluminum.

2. Light Emitting Device

Figure 4:
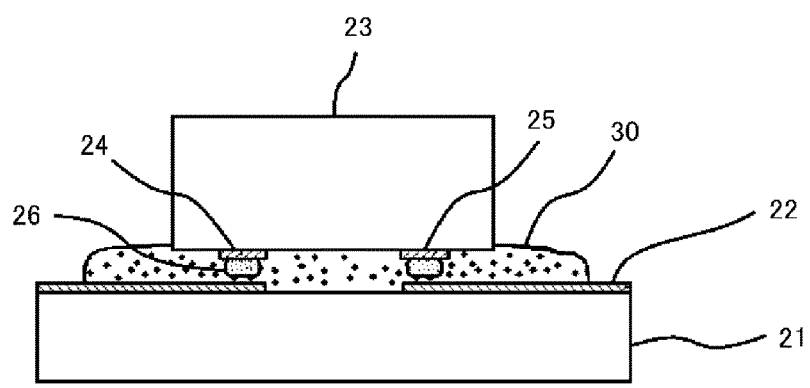
FIG. 4 is a cross-sectional view illustrating an example of a light emitting device.

Next, a light emitting device to which the present invention is applied will be described. FIG. 4 is a cross-sectional view illustrating an example of the light-emitting device. The light emitting device includes a substrate 21 having a wiring pattern 22, an anisotropic conductive film 30 formed on an electrode of the wiring pattern 22, and a light emitting element 23 mounted on the anisotropic conductive film 30. The anisotropic conductive 30 is formed from a cured product of the anisotropic conductive adhesive described above. This light emitting device can be obtained by applying the anisotropic conductive adhesive described above between the wiring pattern 22 on the substrate 21 and connection bumps 26 formed on an n electrode 24 and a p electrode 25 of an LED element as the light emitting element 23; and performing flip-chip mounting of the light emitting element 23 on the substrate 21.

In the present embodiment, using the anisotropic conductive adhesive described above allows the substrate having the wiring pattern made of aluminum to be preferably used. This can reduce the cost of an LED product.

Note that, if necessary, the light emitting element 23 may be sealed by a transparent mold resin so as to cover the entirety of the light emitting element 23. Further, a light reflecting layer may be provided to the light emitting element 23. Further, as the light emitting element, a known light emitting element, other than the LED element, may be used within a range not impairing the effects of the present invention.

EXAMPLES

3. Implementation Examples

Hereinafter, a first implementation example of the present invention will be described.

First Implementation Example

In the first implementation example, an anisotropic conductive adhesive to which various additives were compounded was produced. Then, the reaction start temperature and the reaction peak temperature of an anisotropic conductive adhesive were measured. Further, life of the anisotropic conductive adhesive was evaluated. Further, an LED chip was mounted on a substrate using the anisotropic conductive adhesive to produce an LED mounted sample and die shear strength of the LED mounted sample was measured. Further, peel strength of the anisotropic conductive adhesive was measured. Note that the present invention is not limited to these Examples.

Production of Anisotropic Conductive Adhesive

The anisotropic conductive adhesive was produced by compounding a predetermined amount of one kind of additives shown in Table 1. The anisotropic conductive adhesive was produced by dispersing 100 parts by mass of solder particles having an average particle diameter (D50) of 1.1 µm (trade name: M707 (Sn-3.0Ag-0.5Cu), mp: 217° C., manufactured by Senju Metal Industry Co., Ltd.) and 10 parts by mass of conductive particles having an average particle diameter (D50) of 5 µm (Au plating on a resin core) in a binder in which 100 parts by mass of an alicyclic epoxy compound (trade name: CELLOXIDE 2021P, manufactured by Daicel Corp.), 5 parts by mass of a latent aluminum chelate curing agent, 5 parts by mass of an acrylic resin (butyl acrylate (BA): 15 wt. %, ethyl acrylate (EA): 63 wt %, acrylonitrile (AN): 20 wt %, acrylic acid (AA): 1 wt %, 2-hydroxyetlyl methacrylate (HEMA): 1 wt %, weight-average molecular weight Mw: 700,000), and an additive shown in Table 1 were compounded.

Note that the latent aluminum chelate curing agent was produced as follows. First, 800 parts by mass of distilled water, 0.05 parts by mass of surfactant (NEWREX R-T, manufactured by NOF CORP.), and 4 parts by mass of polyvinyl alcohol (PVA-205, manufactured by Kuraray Co., Ltd.) as a dispersant were charged into a 3-L interfacial polymerization vessel equipped with a thermometer and uniformly mixed. The resulting mixture was further charged with an oil phase solution prepared by dissolving 11 parts by mass of an isopropanol solution containing 24% aluminum monoacetylacetonate bis(ethylacetoacetate) (Aluminum Chelate D, manufactured by Kawaken Fine Chemicals Co., Ltd.) and 11 parts by mass of a methylenediphenyl-4,4'-diisocyanate (3 mol)/trimethylolpropane (1 mol) adduct D-109, manufactured by MITSUI TAKEDA CHEMICALS Inc.) into 30 parts by mass of ethyl acetate. The resulting mixture was emulsified by a homogenizer (10,000 rpm for 10 min). Then, the interfacial polymerization was allowed to proceed at 60° C. for 6 hours. Upon completion of the reaction, the polymerization reaction mixture was allowed to cool down to a room temperature. Particles resulting from the interfacial polymerization were then collected by filtration and allowed to be naturally dried to obtain 20 parts by mass of a latent aluminum chelate curing agent formed in a spherical shape having a particle diameter of about 10 µm.

TABLE 1

| ADDITIVE A | 3-MERCAPTOPROPYLTRIMETHOXYSILANE |
|---|---|
| | 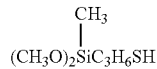 |
| ADDITIVE B | 3-MERCAPTOPROPYLMETHYLDIMETHOXYSILANE |
| | 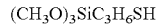 |
| ADDITIVE C | HYDROGENATED EPISULFIDE |
| | 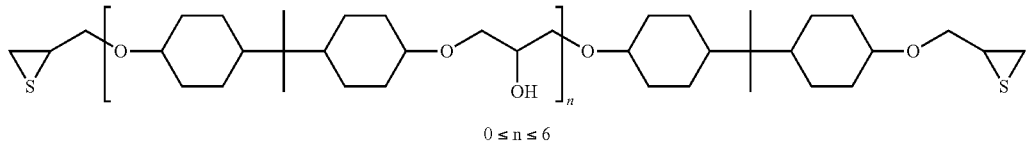 |
| | $0 \leq n \leq 6$ |
| ADDITIVE D | 1,4-BIS(3-MERCAPTOBUTYLYLOXY)BUTANE |
| | 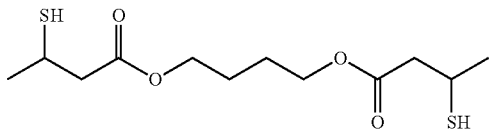 [SMILES: CC(S)CC(=O)OCCCCOC(=O)CC(C)S] |
| ADDITIVE E | PENTAERYTHRITOL TETRAKIS(3-MERCAPTOBUTYRATE) |

TABLE 1-continued

| | | |
|---|---|---|
| ADDITIVE F | 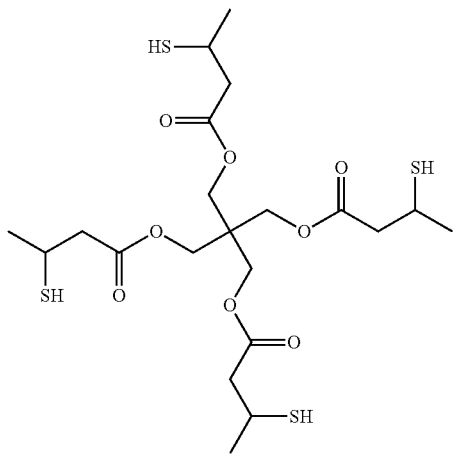 [SMILES: CC(S)CC(=O)OCC(COC(=O)CC(C)S)(COC(=O)CC(C)S)COC(=O)CC(C)S]PENTAERYTHRITOL TETRAKIS(3-MERCAPTOPROPIONATE)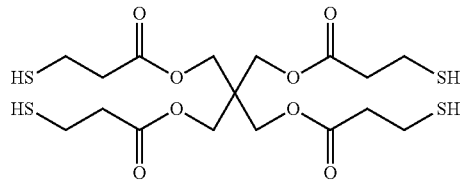 [SMILES: O=C(CCS)OCC(COC(=O)CCS)(COC(=O)CCS)COC(=O)CCS] | |
| ADDITIVE G | 3-GLYCIDOXYPROPYLTRIMETHOXYSILANE | |
| ADDITIVE H | 3-GLYCIDOXYPROPYLTRIETHOXYSILANE | |
| ADDITIVE I | 3-METHACRYLOXYPROPYLMETHYLDIMETHOXYSILANE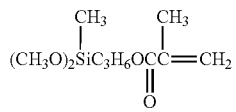 | |
| ADDITIVE J | 3-METHACRYLOXYPROPYLTRIMETHOXYSILANE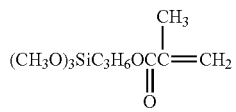 | |

Measurement of Reaction Start Temperature and Reaction Peak Temperature of Anisotropic Conductive Adhesive A reaction start temperature (also referred to as a heat generation start temperature) and a reaction peak temperature (also referred to as a heat generation peak temperature) of the anisotropic conductive adhesive were measured at a heating rate of 10° C./min by using a differential scanning calorimetry (DSC) (DSC6200, manufactured by Seiko Instruments Inc.). Note that, in curing properties, the reaction start temperature corresponds to a curing start temperature, the reaction peak temperature corresponds to a temperature in which the curing is most active, a reaction end temperature corresponds to a curing end temperature, and a peak area corresponds to a heat generation quantity.

Evaluation of Life

An initial heat generation quantity of the anisotropic conductive adhesive and a heat generation quantity of the anisotropic conductive adhesive after it was left at a room temperature for 96 hours were measured by using the differential scanning calorimetry (DSC) (DSC6200, manufactured by Seiko Instruments Inc.). When the heat generation quantity of the anisotropic conductive adhesive left at the room temperature for 96 hours was reduced by 20% or more of the initial heat generation quantity, the life of the anisotropic conductive adhesive was evaluated as "poor". When the heat generation quantity was reduced by less than 20%, the life was evaluated as "excellent".

Production of LED Mounted Sample

Figure 5:
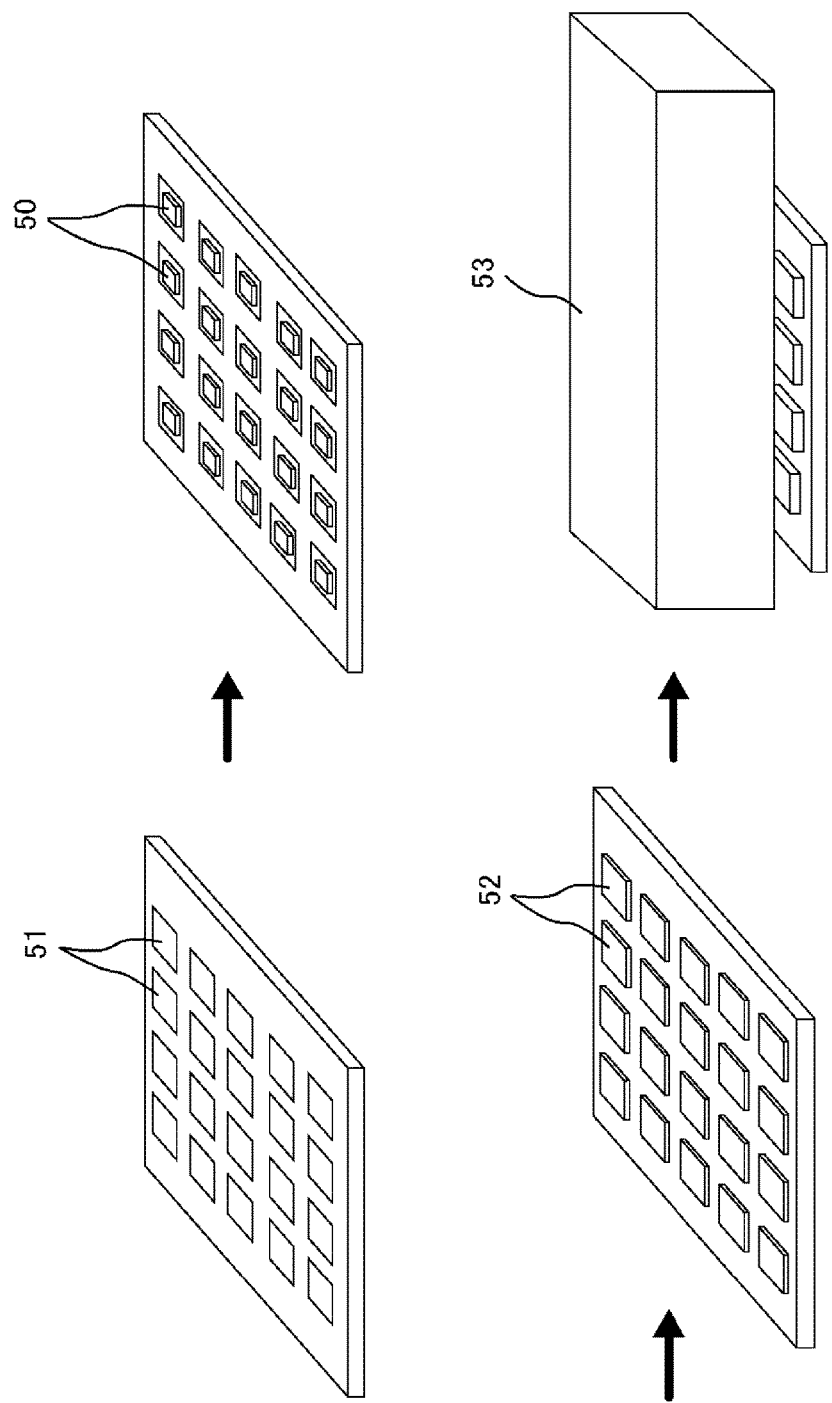
FIG. 5 is a diagram describing production steps of an LED mounted sample.

An LED mounted sample was produced as shown in FIG. 5. A plurality of wiring substrates with a pitch of 50 μm (50 μm Al wiring-25 μm polyimide (PI) layer-50 μm Al base) 51 were arranged on a stage and each wiring substrate 51 was applied with about 10 μg of an anisotropic conductive adhesive 50. An LED chip (trade name: DA3547, manufactured by Cree, Inc. (maximum rated current: 150 mA, size: 0.35 mm×0.46 mm)) 52 was mounted on the anisotropic conductive adhesive 50 by flip-chip mounting using a heat pressing tool 53 under conditions of 180° C.-2N-10 sec for a device A or under conditions of 180° C.-2N-30 sec for a device B to obtain the LED mounted sample.

Figure 6:
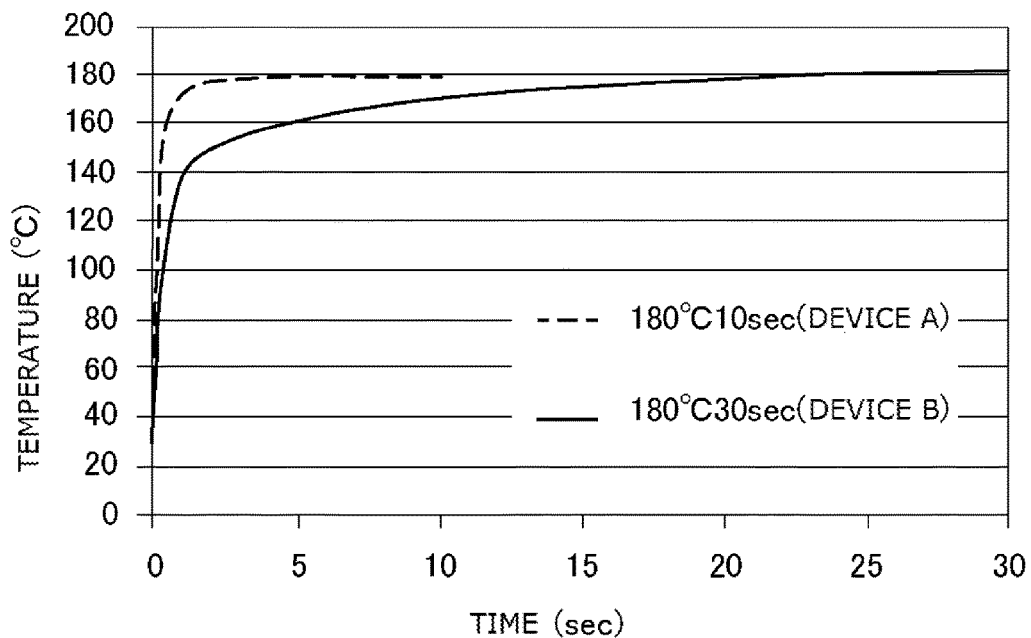
FIG. 6 is a graph showing temperature profiles of 180° C.-10 sec and 180° C.-30 sec.

FIG. 6 is a graph showing temperature profiles of 180° C.-10 sec and 180° C.-30 sec. As shown in FIG. 6, a temperature raising curve of the device A is sharper than that of the device B, making it difficult for the device A to obtain higher die shear strength and peel strength than the device B.

Measurement of Die Shear Strength

Figure 7:
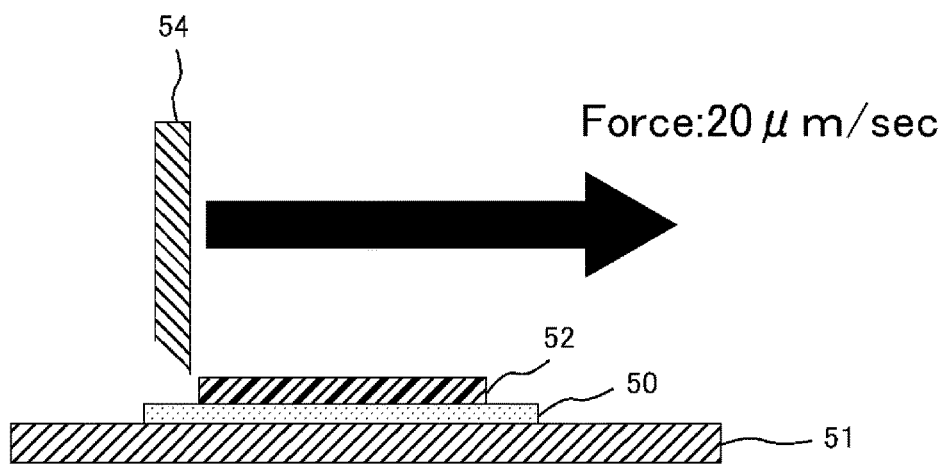
FIG. 7 is a cross-sectional view illustrating an outline of a die shear strength test.

As shown in FIG. 7, the LED mounted samples were measured for their bonding strength using a die shear tester under conditions of a shear rate of a tool 54 of 20 μcm/sec and a temperature of 25° C. The measurement of the bonding strength was performed with four LED mounted samples and their average value was calculated.

Measurement of Peel Strength

An anisotropic conductive adhesive 60 was applied onto a white ceramic plate 61 to a thickness of 100 and an aluminum piece 62 having a size of 1.5 mm×10 mm was thermally compression-bonded on the ceramic plate 61 under conditions of 180° C.-1.5N-10 sec for the device A or under conditions of 180° C.-1.5N-30 sec for the device B to obtain a bonded structure.

Figure 8:
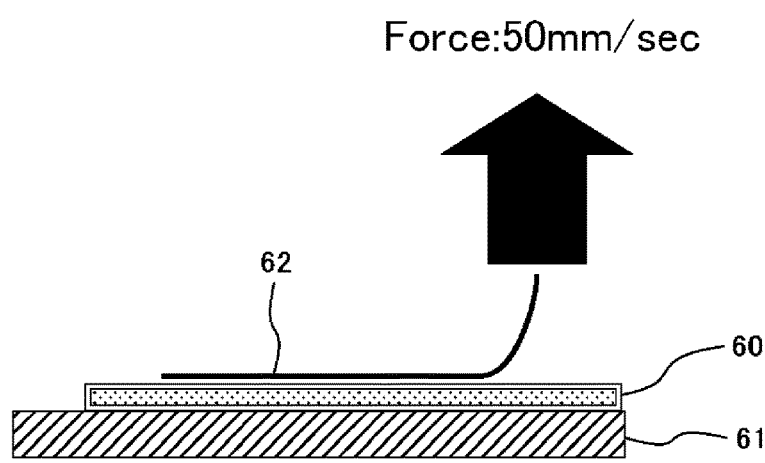
FIG. 8 is a cross-sectional view illustrating an outline of a 90-degree peel strength test.

As shown in FIG. 8, the aluminum piece 62 of the bonded structure was stripped at a tensile rate of 50 mm/sec in a Y-axis direction at an angle of 90° using a Tensilon tester. The maximum peel strength required to strip the aluminum piece 62 was measured. The measurement of the maximum peel strength was performed with four samples and their average value was calculated.

Example 1

An anisotropic conductive adhesive was produced by compounding 1 part by mass of an additive A (3-mercaptopropyltrimethoxysilane). The reaction start temperature of the anisotropic conductive adhesive was 78° C. and the reaction peak temperature was 135° C. Table 2 shows an evaluation result of the life, a measurement result of the die shear strength, and a measurement result of the peel strength.

Example 2

An anisotropic conductive adhesive was produced by compounding 0.5 parts by mass of an additive B (3-mercaptopropylmethyldimethoxysilane). The reaction start temperature of the anisotropic conductive adhesive was 70° C. and the reaction peak temperature was 132° C. Table 2 shows an evaluation result of the life, a measurement result of the die shear strength, and a measurement result of the peel strength.

Example 3

An anisotropic conductive adhesive was produced by compounding 1 part by mass of the additive B mercaptopropylmethyldimethoxysilane). The reaction start temperature of the anisotropic conductive adhesive was 78° C. and the reaction peak temperature was 137° C. Table shows an evaluation result of the life, a measurement result of the die shear strength, and a measurement result of the peel strength.

Example 4

An anisotropic conductive adhesive was produced by compounding 1 part by mass of an additive C (hydrogenated epi sulfide). The reaction start temperature of the anisotropic conductive adhesive was 75° C. and the reaction peak temperature was 131° C. Table 2 shows an evaluation result of the life, a measurement result of the die shear strength, and a measurement result of the peel strength.

Example 5

An anisotropic conductive adhesive was produced by compounding 2 parts by mass of the additive C (hydrogenated episulfide). The reaction start temperature of the anisotropic conductive adhesive was 75° C. and the reaction peak temperature was 138° C. Table 2 shows an evaluation result of the life, a measurement result of the die shear strength, and a measurement result of the peel strength.

Example 6

An anisotropic conductive adhesive was produced by compounding 5 parts by mass of the additive C (hydrogenated episulfide). The reaction start temperature of the anisotropic conductive adhesive was 76° C. and the reaction peak temperature was 157° C. Table 2 shows an evaluation result of the life, a measurement result of the die shear strength, and a measurement result ref the peel strength.

Example 7

An anisotropic conductive adhesive was produced by compounding 10 parts by mass of the additive C (hydrogenated episulfide). The reaction start temperature of the anisotropic conductive adhesive was 76° C. and the reaction peak temperature was 170° C. Table 2 shows an evaluation result of the life, a measurement result of the die shear strength, and a measurement result of the peel strength.

Example 8

An anisotropic conductive adhesive was produced by compounding 40 parts by mass of the additive (hydrogenated episulfide). The reaction start temperature of the anisotropic conductive adhesive was 76° C. and the reaction peak temperature was 176° C. Table 2 shows an evaluation result of the life, a measurement result of the die shear strength, and a measurement result of the peel strength.

Example 9

An anisotropic conductive adhesive was produced by compounding 1 part by mass of an additive D (1,4-bis(3- mercaptobutylyloxy)butane). The reaction start temperature of the anisotropic conductive adhesive was 73° C. and the reaction peak temperature was 153° C. Table 2 shows an evaluation result of the life, a measurement result of the die shear strength, and a measurement result of the peel strength.

Example 10

An anisotropic conductive adhesive was produced by compounding part by mass of an additive E (pentaerythritol tetrakis(3-mercaptobutyrate)). The reaction start temperature of the anisotropic conductive adhesive was 68° C. and the reaction peak temperature was 158° C. Table 2 shows an evaluation result of the life, a measurement result of the die shear strength, and a measurement result of the peel strength.

Example 11

An anisotropic conductive adhesive was produced by compounding 1 part by mass of an additive F (pentaerythritol tetrakis(3-mercaptopropionate)). The reaction start temperature of the anisotropic conductive adhesive was 75° C. and the reaction peak temperature was 155° C. Table 2 shows an evaluation result of the life, a measurement result of the die shear strength, and a measurement result of the peel strength.

Comparative Example 1

An anisotropic conductive adhesive was produced without any additive added. The reaction start temperature of the anisotropic conductive adhesive was 60° C. and the reaction peak temperature was 102° C. Table 2 shows an evaluation result of the life, a measurement result of the die shear strength, and a measurement result of the peel strength.

Comparative Example 2

An anisotropic conductive adhesive was produced by compounding 1 part by mass of an additive G (3-glycidoxypropyitrimethoxysilane). The reaction start temperature of the anisotropic conductive adhesive was 60° C. and the reaction peak temperature was 102° C. Table 2 shows an evaluation result of the life, a measurement result of the die shear strength, and a measurement result of the peel strength.

Comparative Example 3

An anisotropic conductive adhesive was produced by compounding 1 part by mass of an additive H (3-glycidoxypropyltriethoxysilane). The reaction start temperature of the anisotropic conductive adhesive was 60° C. and the reaction peak temperature was 102° C. Table 2 shows an evaluation result of the life, a measurement result of the die shear strength, and a measurement result of the peel strength.

Comparative Example 4

An anisotropic conductive adhesive was produced by compounding 1 part by mass of an additive I (3-methacryloxypropylethyldimethoxysilane). The reaction start temperature of the anisotropic conductive adhesive seas 60° C. and the reaction peak temperature was 102° C. Table 2 shows an evaluation result of the life, a measurement result of the die shear strength, and a measurement result of the peel strength.

Comparative Example 5

An anisotropic conductive adhesive was produced by compounding 1 part by mass of an additive J (3-methacryloxypropyltrimethoxysilane). The reaction start temperature of the anisotropic conductive adhesive was 60° C. and the reaction peak temperature was 102° C. Table 2 shows an evaluation result of the life, a measurement result of the die shear strength, and a measurement result of the peel strength.

TABLE 2

| | | EXAMPLE 1 | | EXAMPLE 2 | | EXAMPLE 3 | | EXAMPLE 4 | | EXAMPLE 5 | | EXAMPLE 6 | | EXAMPLE 7 | | EXAMPLE 8 | |
|---|---|---|---|---|---|---|---|---|---|---|---|---|---|---|---|---|---|
| ADDITIVE | | A | | B | | B | | C | | C | | C | | C | | C | |
| ADDITION AMOUNT [PARTS BY MASS] | | 1 | | 0.5 | | 1 | | 1 | | 2 | | 5 | | 10 | | 40 | |
| DSC MEASUREMENT | REACTION START TEMPERATURE [° C.] | 78 | | 70 | | 78 | | 75 | | 75 | | 76 | | 76 | | 76 | |
| | REACTION PEAK TEMPERATURE [° C.] | 135 | | 132 | | 137 | | 131 | | 138 | | 157 | | 170 | | 176 | |
| EVALUATION OF LIFE | | Excellent | | Excellent | | Excellent | | Excellent | | Excellent | | Excellent | | Excellent | | Excellent | |
| 180° C. CURING CONDITION (sec.) | | 10 | 30 | 10 | 30 | 10 | 30 | 10 | 30 | 10 | 30 | 10 | 30 | 10 | 30 | 10 | 30 |
| DIE SHEAR STRENGTH [N] (Ave.) | | 8 | 8 | 8 | 8 | 8 | 8 | 8 | 8 | 8 | 8 | 8 | 8 | 8 | 8 | 8 | 8 |
| PEEL STRENGTH [N] (Ave.) | | 4 | 4 | 4 | 4 | 4 | 4 | 4 | 4 | 4 | 4 | 4 | 4 | 4 | 4 | 4 | 4 |

| | | EXAMPLE 9 | EXAMPLE 10 | EXAMPLE 11 | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 |
|---|---|---|---|---|---|---|---|---|---|
| ADDITIVE | | D | E | F | None | G | H | I | J |
| ADDITION AMOUNT [PARTS BY MASS] | | 1 | 1 | 1 | None | 1 | 1 | 1 | 1 |
| DSC MEASUREMENT | REACTION START TEMPERATURE [° C.] | 73 | 68 | 75 | 60 | 60 | 60 | 60 | 60 |
| | REACTION PEAK TEMPERATURE [° C.] | 153 | 158 | 155 | 102 | 102 | 102 | 102 | 102 |

TABLE 2-continued

| | | | | | | | | | | | | | | | | |
|---|---|---|---|---|---|---|---|---|---|---|---|---|---|---|---|---|
| EVALUATION OF LIFE | Excellent | | Excellent | | Excellent | | Poor | | Poor | | Poor | | Poor | | Poor | |
| 180° C. CURING CONDITION (sec.) | 10 | 30 | 10 | 30 | 10 | 30 | 10 | 30 | 10 | 30 | 10 | 30 | 10 | 30 | 10 | 30 |
| DIE SHEAR STRENGTH [N] (Ave.) | 8 | 8 | 8 | 8 | 8 | 8 | 6 | 8 | 6 | 8 | 6 | 8 | 6 | 8 | 6 | 8 |
| PEEL STRENGTH [N] (Ave.) | 4 | 4 | 4 | 4 | 4 | 4 | 1 | 3 | 1 | 3 | 1 | 2 | 1 | 2 | 1 | 2 |

When the nucleophilic compound containing a sulfur atom having an unshared electron pair was not compounded as in Comparative examples 1 to 5, the evaluation result of the life was not excellent, and the die shear strength and the peel strength of the adhesive obtained by the pressure bonding using the device A exhibiting the sharp temperature raising curve was lower than those of the adhesive obtained by the pressure bonding using the device B.

On the other hand, when the nucleophilic compound containing a sulfur atom having an unshared electron pair was compounded as in Examples 1 to 11, the evaluation result of the life was excellent, and the die shear strength and the peel strength of the adhesive obtained by the pressure bonding using the device A exhibiting the sharp temperature raising curve were not much different from those of the adhesive obtained by the pressure bonding using the device B. That is, according to Examples 1 to 11, it was confirmed that improving the stability of the aluminum chelate/silanol-based curing catalyst and delaying the curing reaction made it possible to achieve the excellent life performance and the wide margin for mounting.

Second Implementation Example

In a second implementation example, conductivity and heat radiation properties were evaluated using the LED mounted samples mounted under the conditions of 180° C.-2N-30 sec for the device B in Examples 1 and 4 and Comparative examples 1 and 2 described above.

Evaluation of Conductivity

The LED mounted samples were measured for their initial conduction resistance and conduction resistance after a temperature cycle test (TCT). In the temperature cycle test, the LED mounted samples were subjected to temperature cycles 1,000 times, each cycle including 30 minutes of exposure to an atmosphere of −40° C. and 30 minutes of exposure to an atmosphere of 100° C. The conductivity was evaluated by measuring a Vf value at If 50 mA. The LED mounted samples that exhibited an increase in the Vf value of less than 0.1 V from the Vf value in the test result table were evaluated, as "excellent", while the LED mounted samples that exhibited an increase in the Vf value of 0.1 V or more were evaluated as "poor".

Evaluation of Heat Radiation Properties

The LED mounted samples were measured for their initial thermal resistance and thermal resistance after the temperature cycle test (TCT). In the temperature cycle test, similarly to the evaluation of the conductivity, the LED mounted samples were subjected to the temperature cycles 1,000 times, each cycle including 30 minutes of exposure to an atmosphere of −40° C. and 30 minutes of exposure to an atmosphere of 100° C. The thermal resistance was measured by using a transient thermal resistance measuring device of a dynamic system (manufactured by Caper Electronics Co., Ltd.). The measurement was performed by reading out thermal resistance values (K/W) of the LED mounted samples when lit for 0.1 seconds under conditions of If=50 mA and Im=1 mA. When a change in the thermal resistance values was less than 2° C., the heat radiation properties were evaluated as "excellent", while when a change in the thermal resistance values was 2° C. or more, the heat radiation properties were evaluated as "poor".

Examples 1 and 4 and Comparative Examples 1 and 2

Table 3 shows evaluation results of the conductivity and the heat radiation properties in Examples 1 and 4 and Comparative examples 1 and 2.

TABLE 3

| | EXAMPLE 1 | EXAMPLE 4 | COMPARATIVE EXAMPLE 1 | COMPARATIVE EXAMPLE 2 |
|---|---|---|---|---|
| ADDITIVE | A | C | None | G |
| ADDITION AMOUNT [PARTS BY MASS] | 1 | 1 | None | 1 |
| 180° C. CURING CONDITION (sec.) | 30 | 30 | 30 | 30 |
| EVALUATION OF CONDUCTIVITY | Excellent | Excellent | Excellent | Excellent |
| EVALUATION OF HEAT RADIATION PROPERTIES | Excellent | Excellent | Poor | Poor |

When the nucleophilic compound containing a sulfur atom having an unshared electron pair was not compounded as in Comparative examples 1 and the evaluation of the conductivity was excellent, however, the evaluation of the heat radiation properties was not excellent. On the other hand, when the nucleophilic compound containing a sulfur atom having an unshared electron pair was compounded as in Examples 1 and 4, the evaluation of the conductivity and the evaluation of the heat radiation properties were excellent. Measuring the heat radiation properties could detect a subtle change in the mounting state that was not apparent by measuring the die shear strength, the peel strength, and the conduction resistance.

REFERENCE SIGNS LIST 11 wire
11a oxide film
12 sea of epoxy compound
13 island of acrylic resin
21 substrate 22 wiring pattern
23 light emitting element
24 n electrode
25 p electrode
26 bump
30 anisotropic conductive film
50 anisotropic conductive adhesive
51 wiring substrate
52 LED chip
53 heat pressing tool
54 tool
60 anisotropic conductive adhesive
61 ceramic plate
62 aluminum piece

The invention claimed is:

1. An adhesive composition comprising:
a cationic polymerizable compound;
an aluminum chelate/silanol-based curing catalyst; and
a nucleophilic compound containing a sulfur atom having an unshared electron pair, wherein
the nucleophilic compound has two or more thiol groups per molecule.

2. The adhesive composition according to claim 1, wherein
the aluminum chelate/silanol-based curing catalyst includes an aluminum chelate curing agent and a silanol compound, and
the aluminum chelate curing agent and the silanol compound constitute a latent aluminum chelate curing agent carried by a porous resin obtained through interfacial polymerization of a polyfunctional isocyanate compound.

3. The adhesive composition according to claim 1, wherein
the aluminum chelate/silanol-based curing catalyst includes an aluminum chelate curing agent and a silane coupling agent, and
the aluminum chelate curing agent is a latent aluminum chelate curing agent carried by a porous resin obtained through interfacial polymerization of a polyfunctional isocyanate compound.

4. The adhesive composition according to claim 1, wherein
the cation polymerizable compound includes an alicyclic epoxy compound or a hydrogenated epoxy compound, and
the adhesive composition further comprises an acrylic resin obtained by polymerization of 0.5 to 10 wt % of acrylic acid and 0.5 to 10 wt % of an acrylic acid ester having a hydroxyl group and having a weight-average molecular weight of 50,000 to 900,000.

5. The adhesive composition according to claim 1, wherein a reaction peak temperature at a temperature rising rate of 10° C./min measured by a differential scanning calorimeter is higher than a reaction start temperature by 50° C. or more.

6. The adhesive composition according to claim 1, further comprising conductive particles obtained by forming a metal layer on surfaces of resin particles and solder particles having an average particle diameter smaller than that of the conductive particles.

7. A light emitting device comprising:
a substrate having a wiring pattern;
an anisotropic conductive film formed on an electrode of the wiring pattern; and
a light emitting element mounted on the anisotropic conductive film, wherein
the anisotropic conductive film is a cured product of an anisotropic conductive adhesive including a cationic polymerizable compound, an aluminum chelate/silanol-based curing catalyst, and a nucleophilic compound containing a sulfur atom having an unshared electron pair.

8. The light emitting device according to claim 7, wherein the wiring pattern of the substrate is formed from aluminum.

9. An adhesive composition comprising:
a cationic polymerizable compound;
an aluminum chelate/silanol-based curing catalyst; and
a nucleophilic compound containing a sulfur atom having an unshared electron pair, wherein
the nucleophilic compound is a mercaptoalkanoate.

10. An adhesive composition comprising:
a cationic polymerizable compound;
an aluminum chelate/silanol-based curing catalyst; and
a nucleophilic compound containing a sulfur atom having an unshared electron pair, wherein
the nucleophilic compound is an episulfide compound.

11. The adhesive composition according to claim 10, wherein the episulfide compound has two or more episulfide groups per molecule.

* * * * *